(12) United States Patent
Robin et al.

(10) Patent No.: US 9,711,694 B2
(45) Date of Patent: Jul. 18, 2017

(54) OPTOELECTRONIC DEVICE WITH LIGHT-EMITTING DIODES

(71) Applicants: Commissariat â l'Energie Atomique et aux Energies Alternatives, Paris (FR); ALCATEL LUCENT, Boulogne Billancourt (FR)

(72) Inventors: Ivan Christophe Robin, Grenoble (FR); Hubert Bono, Grenoble (FR); Alain Fargeix, Grenoble (FR); Ricardo Izquierdo, Villard de Lans (FR); Stéphanie Le Calvez, Sassenage (FR); Audrey Sanchot, Grenoble (FR)

(73) Assignees: Commissariat à l'Energie Atomique et aux Energies Alternatives, Paris (FR); ALCATEL LUCENT, Boulogne Billancourt (FR)

( * ) Notice: Subject to any disclaimer, the term of this patent is extended or adjusted under 35 U.S.C. 154(b) by 0 days.

(21) Appl. No.: 14/944,293

(22) Filed: Nov. 18, 2015

(65) Prior Publication Data
US 2016/0141469 A1    May 19, 2016

(30) Foreign Application Priority Data

Nov. 18, 2014    (FR) ...................................... 14 61099

(51) Int. Cl.
*H01L 33/50* (2010.01)
*H01L 27/15* (2006.01)
(Continued)

(52) U.S. Cl.
CPC .......... *H01L 33/507* (2013.01); *H01L 27/156* (2013.01); *H01L 33/502* (2013.01); *H01L 33/505* (2013.01); *H01L 25/167* (2013.01); *H01L 33/0079* (2013.01); *H01L 33/504* (2013.01); *H01L 33/508* (2013.01); *H01L 33/60* (2013.01); *H01L 33/62* (2013.01);
(Continued)

(58) Field of Classification Search
CPC ... H01L 33/502; H01L 33/505; H01L 33/507; H01L 27/156
See application file for complete search history.

(56) References Cited

U.S. PATENT DOCUMENTS 6,207,229 B1    3/2001    Bawendi et al.
2004/0145629 A1    7/2004    Silverbrook
(Continued)

FOREIGN PATENT DOCUMENTS

EP    2500626 A2    9/2012
WO    2014030830 A1    2/2014

OTHER PUBLICATIONS

Preliminary Search Report filed in FR 14/61099 dated Jul. 14, 2015; 5 pages.
(Continued)

*Primary Examiner* — Matthew Reames
(74) *Attorney, Agent, or Firm* — Moreno IP Law LLC

(57) ABSTRACT

An optoelectronic device including an array of light-emitting diodes and photoluminescent blocks opposite at least part of the light-emitting diodes, each light-emitting diode having a lateral dimension smaller than 30 μm, each photoluminescent block including semiconductor crystals having an average size smaller than 1 μm, dispersed in a binding matrix.

3 Claims, 5 Drawing Sheets

(51) Int. Cl.
  *H01L 25/16* (2006.01)
  *H01L 33/60* (2010.01)
  *H01L 33/00* (2010.01)
  *H01L 33/62* (2010.01)
(52) U.S. Cl.
  CPC ............. *H01L 2924/0002* (2013.01); *H01L 2933/0041* (2013.01)

(56) References Cited

U.S. PATENT DOCUMENTS

| | | |
|---|---|---|
| 2006/0160257 A1 | 7/2006 | Wu et al. |
| 2009/0078955 A1 | 3/2009 | Fan et al. |
| 2009/0213296 A1 | 8/2009 | Park et al. |
| 2011/0175117 A1 | 7/2011 | Jagt et al. |
| 2011/0294240 A1 | 12/2011 | Kim |
| 2011/0297975 A1 | 12/2011 | Yeh et al. |
| 2014/0339582 A1* | 11/2014 | Matsumura ............ H01L 33/505 257/98 |

OTHER PUBLICATIONS

B. Damilano, P. Demolon, J. Brault and F. Natali; Blue-Green and White Color Tuning of Monolithic Light Emitting Diodes; Journal of Applied Physics, Oct. 2010 ; 6 pages.

* cited by examiner

OPTOELECTRONIC DEVICE WITH LIGHT-EMITTING DIODES

This application claims the priority benefit of French Patent application number 14/61099, filed on Nov. 18, 2014, the contents of which is hereby incorporated by reference in its entirety to the maximum extent allowable by law.

BACKGROUND

The present disclosure relates to an optoelectronic device, particularly a display screen or an image projection device, with light-emitting diodes based on semiconductor materials and their manufacturing methods.

DISCUSSION OF THE RELATED ART

There exist optoelectronic devices comprising light-emitting diodes based on semiconductor materials comprising a stack of semiconductor layers mainly comprising at least one group-III element and one group-V element, called III-V compound hereafter, particularly gallium nitride (GaN), gallium indium nitride (GaInN), and gallium aluminum nitride (GaAlN).

Light-emitting diodes based on GaN currently available for sale are capable of emitting an ultraviolet radiation or blue light. It is known that the proportion of indium in GaInN enables to increase the wavelength of the emitted radiation. However, when the indium proportion rises above 20% by mass, the quantum efficiency of the light-emitting diode strongly decreases.

It is known to cover a light-emitting diode with a layer of photoluminescent materials to convert at least part of the radiation emitted by the light-emitting diode into a radiation at another wavelength. An example of a photoluminescent material is yttrium aluminum garnet (YAG) activated by the trivalent cerium ion, also called YAG:Ce or YAG:Ce$^{3+}$. The average size of the particles of conventional photoluminescent materials is generally greater than 5 µm.

An optoelectronic device such as a display screen or a projection device, based on light-emitting diodes, may comprise an array of display pixels emitting red, green, or blue light, each display pixel comprising at least one light-emitting diode. To obtain display pixels emitting red or green light, a possibility is to provide an array of light-emitting diodes emitting blue light and to cover certain of these light-emitting diodes with a photoluminescent material capable of converting blue light into red or green light.

There is a tendency to decrease the dimensions of display pixels, particularly to increase the resolution of display screens or of projection devices. The lateral dimensions of the light-emitting diodes may then be smaller than 30 µm. However, the thickness of the photoluminescent material, such as YAG:Ce$^{3+}$, should be greater than several hundred micrometers to convert the entire light radiation supplied by a light-emitting diode. A disadvantage is that the use of such photoluminescent materials is not compatible with the forming of light-emitting diodes of small lateral dimensions.

SUMMARY

An object of an embodiment aims at overcoming all or part of the disadvantages of the previously-described optoelectronic devices comprising light-emitting diodes.

Another object of an embodiment is that the light-emitting diodes comprise a stack of semiconductor layers mainly comprising a III-V compound.

Another object of an embodiment is that the lateral dimensions of the light-emitting diodes are smaller than 30 µm.

Another object of an embodiment is that the optoelectronic device comprises an array of display pixels each emitting green, red, or blue light.

Thus, an embodiment provides an optoelectronic device comprising an array of light-emitting diodes and photoluminescent blocks opposite at least part of the light-emitting diodes, each light-emitting diode having a lateral dimension smaller than 30 µm, each photoluminescent block comprising semiconductor crystals having an average size smaller than 1 µm, dispersed in a binding matrix.

According to an embodiment, each photoluminescent block has a thickness smaller than 50 µm, preferably smaller than 5 µm.

According to an embodiment, the average size of the semiconductor crystals is smaller than 500 nm, preferably smaller than 50 nm.

According to an embodiment, the semiconductor crystals are made of at least one material selected from the group comprising cadmium selenide, indium phosphide, cadmium sulfide, zinc sulfide, zinc selenide, cadmium telluride, zinc telluride, cadmium oxide, zinc cadmium oxide, cadmium zinc sulfide, cadmium zinc selenide, silver indium sulfide, and a mixture of at least two of these compounds.

According to an embodiment, the binding matrix is made of an at least partly transparent polymer.

According to an embodiment, each light-emitting diode comprises a stack of semiconductor portions.

According to an embodiment, the device comprises a grid defining openings located opposite the light-emitting diodes, the photoluminescent blocks being arranged in some of the openings.

According to an embodiment, each photoluminescent block is laterally surrounded with a reflective wall.

According to an embodiment, the device comprises a first electronic circuit comprising the light-emitting diodes and a second electronic circuit bonded to the first electronic circuit by direct bonding and electrically connected to the light-emitting diodes.

An embodiment also provides a method of manufacturing an optoelectronic device, comprising the steps of:
  (a) forming an array of light-emitting diodes, each light-emitting diode having a lateral dimension smaller than 30 µm; and
  (b) forming photoluminescent blocks opposite at least part of the light-emitting diodes, each photoluminescent block comprising semiconductor crystal, having an average size smaller than 1 µm, dispersed in a binding matrix.

According to an embodiment, each photoluminescent block has a thickness smaller than 30 µm, preferably smaller than 5 µm.

According to an embodiment, step (a) comprises manufacturing an optoelectronic circuit comprising the light-emitting diodes and step (b) comprises forming the photoluminescent blocks by an additive process on the optoelectronic circuit.

According to an embodiment, step (b) comprises forming the photoluminescent blocks by three-dimensional printing on the optoelectronic circuit.

According to an embodiment, step (a) comprises manufacturing an optoelectronic circuit comprising the light-emitting diodes and step (b) comprises forming non-through openings in a substrate, forming the photoluminescent blocks in some of the openings, bonding the substrate to the optoelectronic circuit and thinning the substrate to expose the photoluminescent blocks.

The foregoing and other features and advantages will be discussed in detail in the following non-limiting description of specific embodiments in connection with the accompanying drawings.

DETAILED DESCRIPTION

Figure 1:
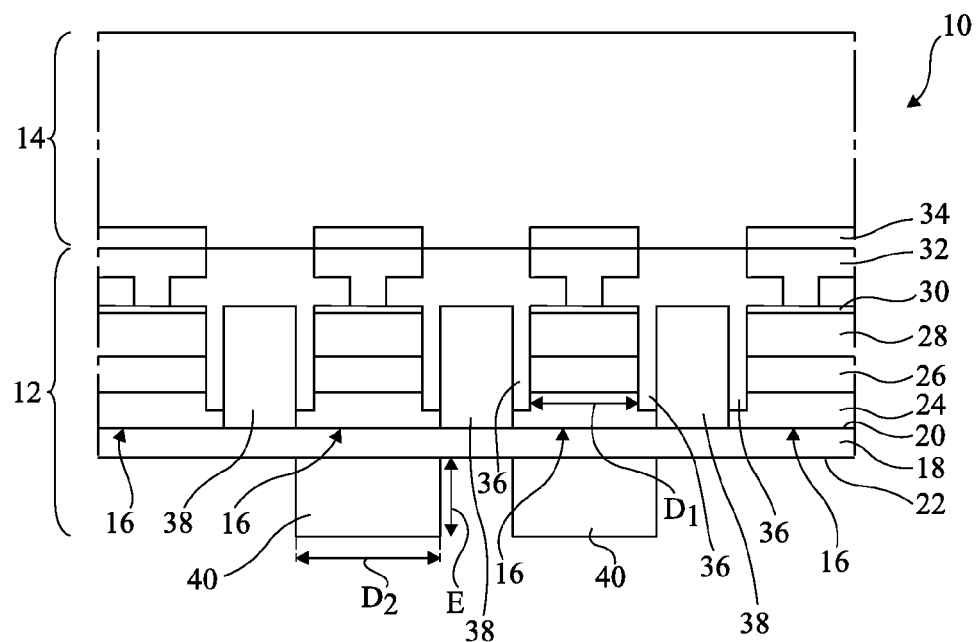
FIGS. 1 and 2 are partial simplified cross-section views of embodiments of an optoelectronic device.

For clarity, the same elements have been designated with the same reference numerals in the various drawings and, further, as usual in the representation of integrated circuits, the various drawings are not to scale. Further, in the following description, expressions "substantially", "around", and "approximately" mean "to within 10%". Further, only those elements which are useful to the understanding of the present description have been shown and will be described. In particular, the means for biasing a light-emitting diode of an optoelectronic device are well known and will not be described.

In the following description, "active area" of a light-emitting diode designates the region of the light-emitting diode from which most of the electromagnetic radiation provided by the light-emitting diode is emitted. Further, term "particle" such as used in the context of the present disclosure should be understood in a broad sense and corresponds not only to compact particles more or less having a spherical shape but also to angular particles, to flattened particles, to flake-shaped particles, to fiber-shaped particles, or to fibrous particles, etc. It should be understood that the "size" of particles in the context of the present disclosure means the smallest transverse dimension of the particles. Particles of a material means the particles considered individually, that is, the unit elements of the material, knowing that the material may appear in the form of particle clusters. Phrase "average size" of particles means according to the present disclosure the arithmetic average of the particle sizes, that is, the sum of the particle sizes divided by the number of particles. The granulometry of the particles may be measured by laser granulometry by using, for example, a Malvern Mastersizer 2000.

FIG. 1 shows an embodiment of an optoelectronic device 10, for example corresponding to a display screen or to an image projection device.

Device 10 comprises two integrated circuits 12, 14. First integrated circuit 12 comprises light-emitting diodes 16 and is called optoelectronic circuit or optoelectronic chip in the following description. Second integrated circuit 14 comprises electronic components, not shown, especially transistors, used to control the light-emitting diodes 16 of first integrated circuit 12. Second integrated circuit 14 is called control circuit or control chip in the following description. Optoelectronic circuit 12 is bonded to control circuit 14. According to the bonding type, inserts may be present between optoelectronic chip 12 and control chip 14.

According to an embodiment, each light-emitting diode 16 comprises a stack of semiconductor layers each mainly containing at least one III-V compound. According to a first example, light-emitting diodes 16 have the structure described in patent application FR14/50077 which is incorporated herein by reference, where light-emitting diodes 16 have a common cathode. According to a second example, light-emitting diodes 16 have the structure described in the publication entitled "III-nitride micro-emitter arrays: development and applications" of Z. Y. Fan, J. Y. Lin, and H. X. Jiang (Journal of Physics D: Applied Physics, volume 41, number 9, pages 094001, 2008).

According to an embodiment, optoelectronic circuit 12 comprises a semiconductor layer 18 comprising parallel opposite surfaces 20 and 22. Light-emitting diodes 16 rest on surface 20 of layer 18. Layer 18 is for example a heavily-doped semiconductor layer of a first conductivity type, for example, type N. Layer 18 is for example made of a III-V compound, especially a III-N compound. Examples of III-N compounds are GaN, AlN, InN, InGaN, AlGaN, or AlInGaN. The thickness of layer 18 may be in the range from 500 nm to 50 µm, preferably from 1 µm to 6 µm.

Each light-emitting diode 16 comprises a stack of semiconductor layer portions comprising, from bottom to top in FIG. 1:

a doped semiconductor portion 24 of the first conductivity type, for example, N-type doped, in contact with surface 20 of layer 18;

an active area 26; and a doped semiconductor portion 28 of a second conductivity type opposite to the first conductivity type, for example, P-type doped.

According to another embodiment, semiconductor layer 18 may be absent.

According to an embodiment, active area 26 and semiconductor portions 24 and 28 each mainly comprise at least one III-V compound, particularly a III-N compound. Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. Active area 26 and semiconductor portions 24 and 28 may each comprise a dopant.

Active area 26 may comprise a single quantum well. It may then comprise a semiconductor material different from the semiconductor material forming semiconductor portions 24 and 28 and having a bandgap smaller than that of semiconductor portions 24 and 28. Active area 26 may comprise multiple quantum wells. It then comprises a stack of semiconductor layers forming an alternation of quantum wells and of barrier layers.

The thickness of semiconductor portion 24 may be in the range from 0.1 µm and 20 µm. The thickness of semiconductor portion 28 may be in the range from 50 nm and 20 µm. The thickness of active area 26 may be in the range from 10 nm to 500 nm. Width D1 of each light-emitting diode 16 may be smaller than 30 µm, preferably from 5 µm to 30 µm.

For each light-emitting diode 16, an electrically-conductive portion 30 covers semiconductor portion 28. Conductive portions 30 are for example made of aluminum or of silver. The thickness of each conductive portion 30 is for example between 3 nm and 400 nm. Connection elements 32, formed in a stack of insulating layers, electrically connect conductive portion 30 to control chip 14. Conductive portions 34 of control chip 14 in contact with connection elements 32 are shown in FIG. 1.

For each light-emitting diode 16, the lateral sides of semiconductor portion 28, of active area 26, and of at least a portion of semiconductor portion 24 are covered with an insulating portion 36. The thickness of each insulating portion 36 may be selected to be such that portions 36 have an acceptable leakage current on each of light-emitting diodes 16.

Electrically-conductive blocks 38 are provided between light-emitting diodes 16. Blocks 38 are electrically insulated from semiconductor portions 28 and from active areas 26 of the light-emitting diodes by insulating portions 36. Conductive blocks 38 are in contact with surface 20 of layer 18. Blocks 38 may further be in contact with a portion of semiconductor portions 24. Connection elements, similar to connection elements 32 and 34 and which are not shown, electrically connect conductive blocks 38 to control chip 14.

Optoelectronic chip 12 comprises photoluminescent blocks 40 on surface 22 of layer 18 opposite at least certain light-emitting diodes 16. Width D2 of each photoluminescent block 40 may be substantially the same as width D1 of each light-emitting diode 16, that is, smaller than 30 µm, preferably from 5 µm to 30 µm. Thickness E of each photoluminescent block 40 is smaller than 50 µm, preferably smaller than 30 µm, more preferably smaller than 5 µm, more preferably still in the range from 0.1 µm to 5 µm, for example, approximately 1 µm.

Each photoluminescent block 40 comprises a matrix having nanometer-range monocrystalline particles of a semiconductor material, also called semiconductor nanocrystals hereafter, dispersed therein. The internal quantum efficiency $QY_{int}$ of a photoluminescent material is equal to the ratio of the number of emitted photons to the number of photons absorbed by the photoluminescent substance. Internal quantum efficiency $QY_{int}$ of the semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum boxes.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide ($AgInS_2$), and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

The matrix is made of an at least partly transparent material. The matrix is for example made of silica. The matrix is for example made of any at least partly transparent plastic material, particularly of an at least partly transparent polymer, particularly of silicone or of polyacetic acid (PLA). The matrix may be made of an at least partly transparent polymer used with three-dimensional printers, such as PLA.

According to an embodiment, the matrix contains from 2% to 90%, preferably from 10% to 60%, by mass of nanocrystals, for example, approximately 20% by mass of nanocrystals.

The medium comprising the matrix and the semiconductor nanocrystals has an absorption coefficient greater than $10^3$ cm$^{-1}$.

The semiconductor nanocrystals are direct bandgap materials while conventional photoluminescent materials, such as YAG:Ce$^{3+}$, are indirect bandgap materials. Thereby, although the internal quantum efficiency of semiconductor nanocrystals is lower than the internal quantum efficiency of conventional photoluminescent materials, such as YAG:Ce$^{3+}$, the thickness of photoluminescent blocks 40 may be smaller than 30 µm, and preferably smaller than 5 µm, since the conversion duration is shorter. The thickness of photoluminescent blocks 40 depends on the nanocrystal concentration and on the type of nanocrystals used.

Figure 2:
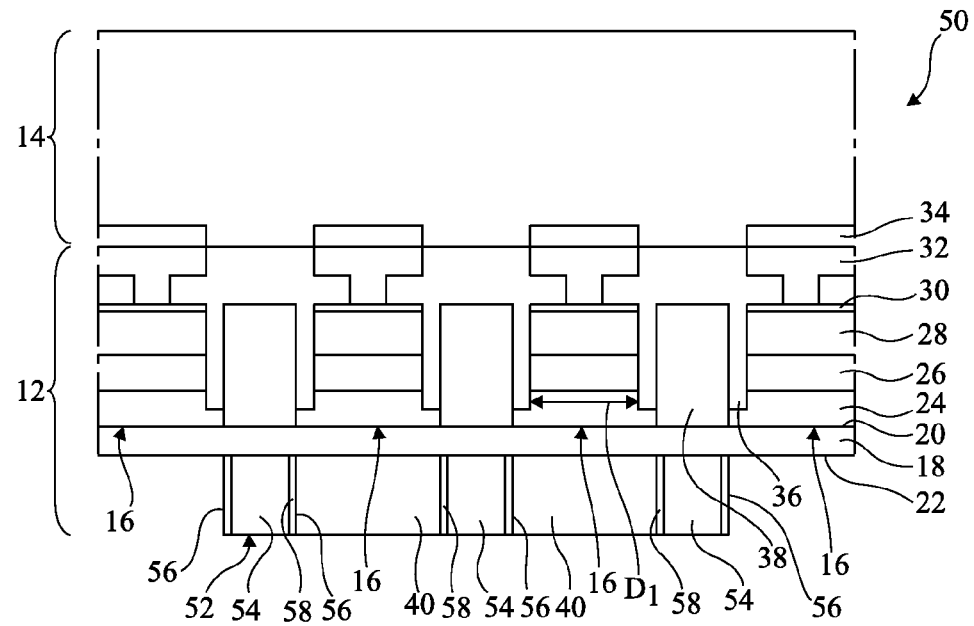

FIG. 2 shows another embodiment of an optoelectronic device 50 comprising all the elements of optoelectronic device 10 and further comprising a grid 52 resting on surface 22 of layer 18. Grid 52 comprises a network of walls 54 which define openings 56, each opening 56 being located opposite a light-emitting diode 16. Photoluminescent blocks 40 are arranged in some of openings 56. Grid 52 may be made of an insulating, semiconductor, or conductive material. As an example, grid 52 is made of silicon.

According to an embodiment, the lateral walls of walls 54 are covered with a coating 58 capable of reflecting the radiation emitted by photoluminescent blocks 40. Coating 58 is, for example, an aluminum film having a thickness in the range from 10 nm to 2 µm. This advantageously enables to improve the contrast of the display device by preventing the radiation emitted by a light-emitting diode from reaching the photoluminescent block associated with an adjacent light-emitting diode.

FIGS. 3A to 3J illustrate an embodiment of a method of manufacturing optoelectronic device 10 shown in FIG. 1 where the light-emitting diode forming method corresponds to that described in patent application FR14/50077.

Figure 3A:
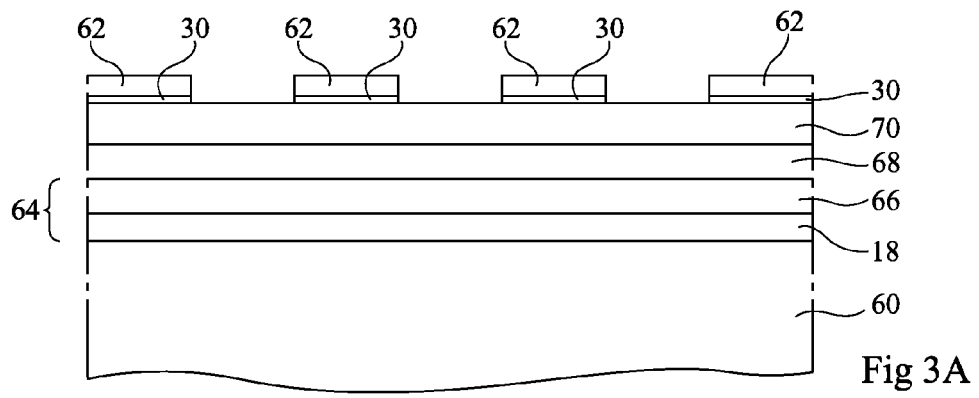
FIGS. 3A to 3J are partial simplified cross-section views of the structures obtained at successive steps of another embodiment of a method of manufacturing the optoelectronic device shown in FIG. 1.

FIG. 3A shows the structure obtained after having formed on substrate 60 a stack of semiconductor layers from which light-emitting diodes 16 will be formed, conductive portions 30 on the stack and dielectric portions 62 on conductive portions 30. Substrate 60 may correspond to a one-piece structure or correspond to a layer covering a support made of another material, for example, glass or metal. The substrate for example is a semiconductor substrate such as a substrate made of silicon, of germanium, of silicon carbide, of a III-V compound, such as GaN or GaAs, of a II-VI compound, such as ZnO. Preferably, the substrate is made of silicon, particularly of single-crystal silicon or polysilicon.

Substrate 60 is for example an insulating substrate, for example, a sapphire substrate.

The stack comprises, from bottom to top in FIG. 3A:

an N-type doped semiconductor layer 64, for example, based on GaN, which comprises a first more heavily-doped portion forming semiconductor layer 18, covering substrate 60, and covered with a less heavily-doped portion forming an N-doped semiconductor layer 66. As a variation, the two layers 18 and 66 may correspond to two layers of different materials, with, for example, layer 18 which may be based on GaN and layer 66, which may be made of InGaN. Further, whether the two layers 18 and 66 correspond to two layers of different materials or to a single layer of a same material, the doping level of the two layers 18 and 66 may be similar or not;

active layers 68 corresponding to an alternated stack of one or a plurality of quantum well emissive layers, for example, based on InGaN, and of barrier layers, for example, based on GaN;

a P-type doped semiconductor layer 70, for example, made of GaN.

Conductive portions 30 are for example formed by a deposition of a layer of electrically-conductive material, for example, aluminum or silver, followed by a lithography and by an etching.

Conductive portions 30 and dielectric portions 62 each have a shape and dimensions, in the plane of the upper surface of semiconductor layer 70 on which they are formed, substantially similar to those desired for light-emitting diodes 16, and for example a disk-shaped cross-section.

Figure 3B:
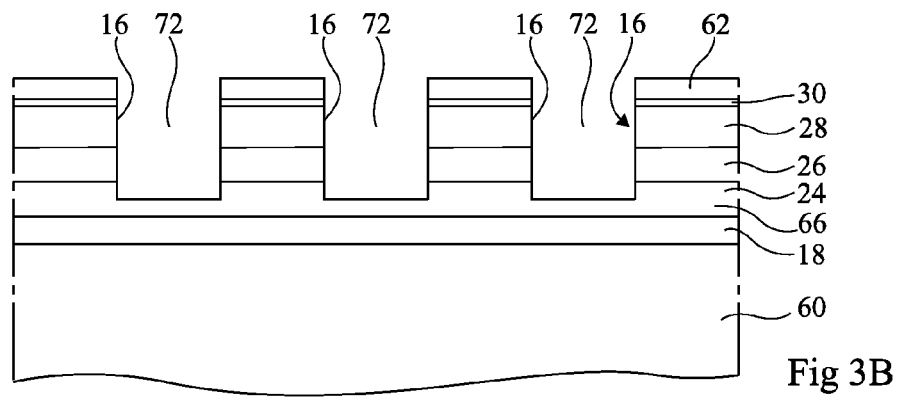

FIG. 3B shows the structure obtained after having etched semiconductor layer 70, active layers 68, and a first portion of semiconductor layer 66 according to the pattern defined by dielectric portions 62, forming, for each light-emitting diode 16, a mesa structure, for example, of cylindrical shape, comprising active area 26 arranged between semiconductor portions 24 and 28. This etching is stopped at a depth level located in semiconductor layer 66 such that a portion of layer 66 is kept at the bottom of each of the etched areas of the stack.

The etch step forms, between light-emitting diodes 16, empty spaces 72 which are subsequently used to form a cathode common to light-emitting diodes 16. The implemented etching is a dry etching, for example via a plasma based on $Cl_2$ or a reactive ion etching (RIE).

Figure 3C:
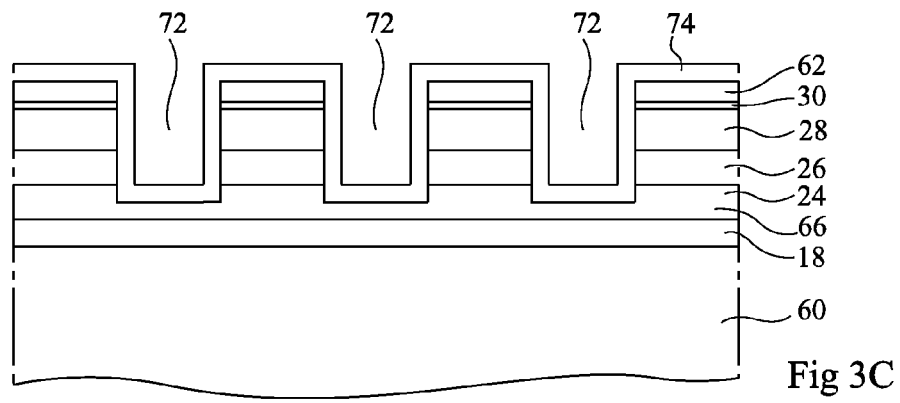

FIG. 3C shows the structure obtained after having conformally deposited a dielectric layer 74, for example, based on SiN, for example in the range from approximately 3 nm to 100 nm, on dielectric portions 62 and along the walls of empty spaces 72, and thus particularly covering the lateral walls of conductive portions 30, of semiconductor portions 28, of active areas 26, and of part of semiconductor portions 24.

Figure 3D:
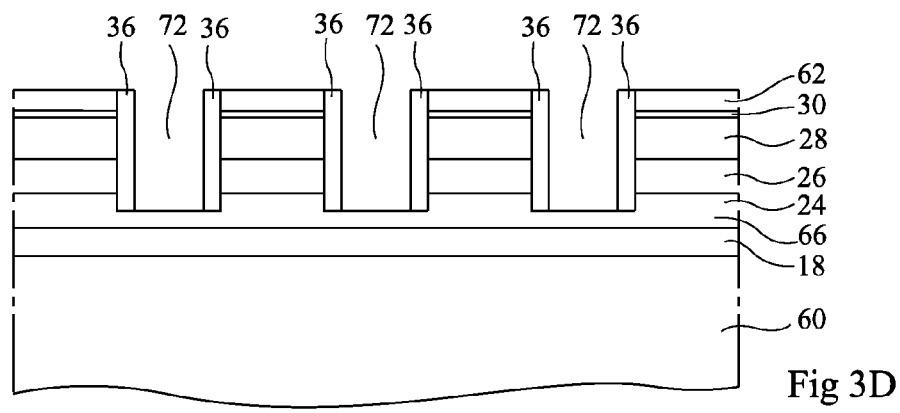

FIG. 3D shows the structure obtained after having performed an anisotropic etching, for example, a dry etching, to remove the portions of dielectric layer 74 located at the bottom of empty spaces 74 and on dielectric portions 62. Dielectric portions 36 are thus obtained.

Figure 3E:
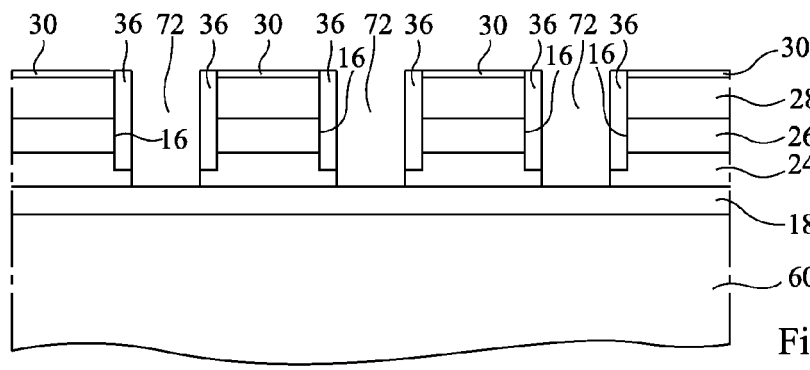

FIG. 3E shows the structure obtained after having etched the rest of semiconductor layer 66 at the bottom of empty spaces 72 all the way to semiconductor layer 18, after having etched dielectric portions 62.

Figure 3F:
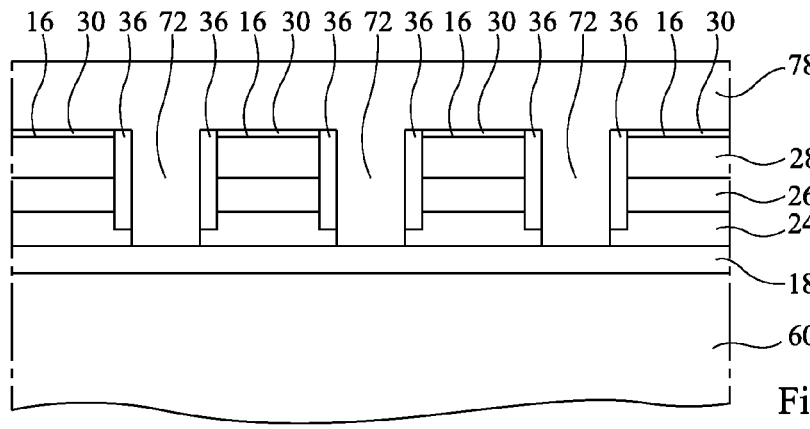

FIG. 3F shows the structure obtained after having deposited an electrically-conductive material 78 which fills empty spaces 72 and covers light-emitting diodes 16. As an example, conductive material 78 is formed by the deposition of a first titanium layer having a thickness for example equal to approximately 10 nm, followed by a deposition of a second aluminum layer having a thickness for example equal to approximately 1 µm.

Figure 3G:
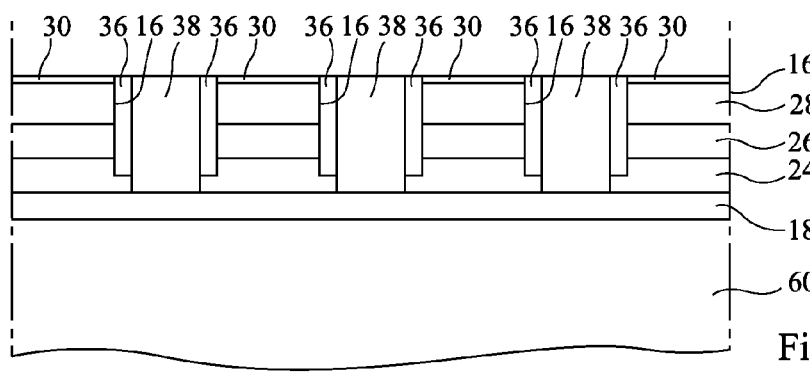

FIG. 3G shows the structure obtained after having performed a planarization step, such as a chem.-mech. polishing (CMP), and/or an etching step, such as a RIE etching, of electrically-conductive material 78 until it reaches the upper surfaces of conductive portions 30 and of dielectric portions 76. The remaining portions of conductive material 136 arranged between light-emitting diodes 16 correspond to conductive blocks 38.

Figure 3H:
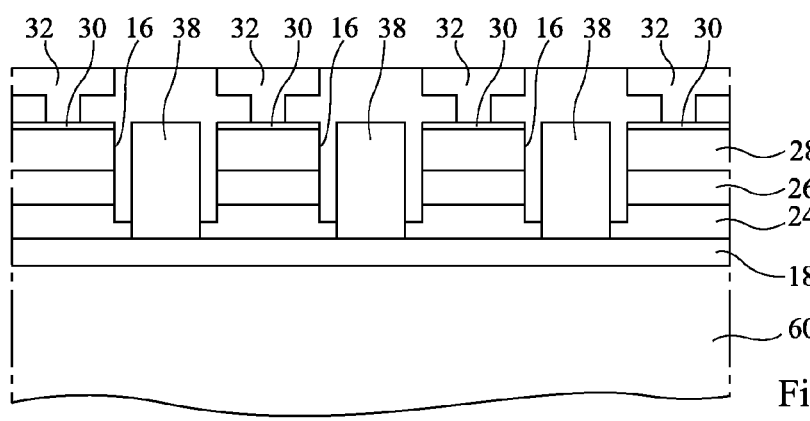

FIG. 3H shows the structure obtained after having formed connection elements 32 in contact with conductive portions 30 and conductive blocks 38.

Figure 3I:
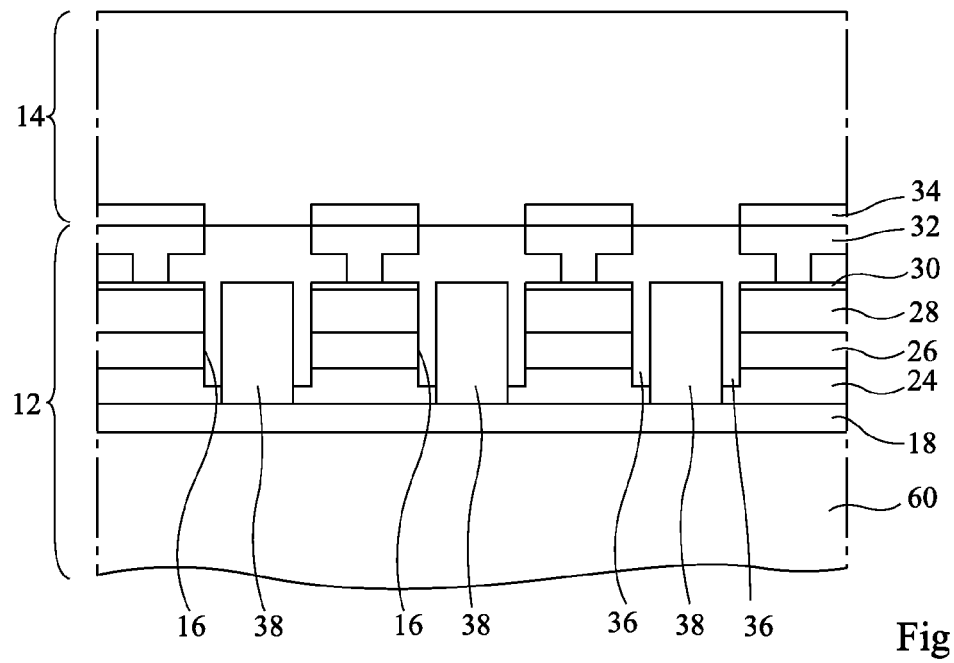

FIG. 3I shows the structure obtained after having bonded control chip 14 to optoelectronic chip 12 on the side of connection elements 32. The bonding of control chip 14 to optoelectronic chip 12 may be performed by direct bonding, with no use of inserts such as connection microbeads. The direct bonding may comprise a direct metal-to-metal bonding of metal areas 32 of optoelectronic chip 12 and of metal areas 34 of control chip 14 and a dielectric-to-dielectric bonding of the dielectric areas at the surface of optoelectronic chip 12 and of the dielectric areas at the surface of control chip 14. The bonding of control chip 14 to optoelectronic chip 12 may be performed by a thermocompression method where optoelectronic chip 12 is placed against control chip 14, with a pressure and a heating being applied.

Figure 3J:
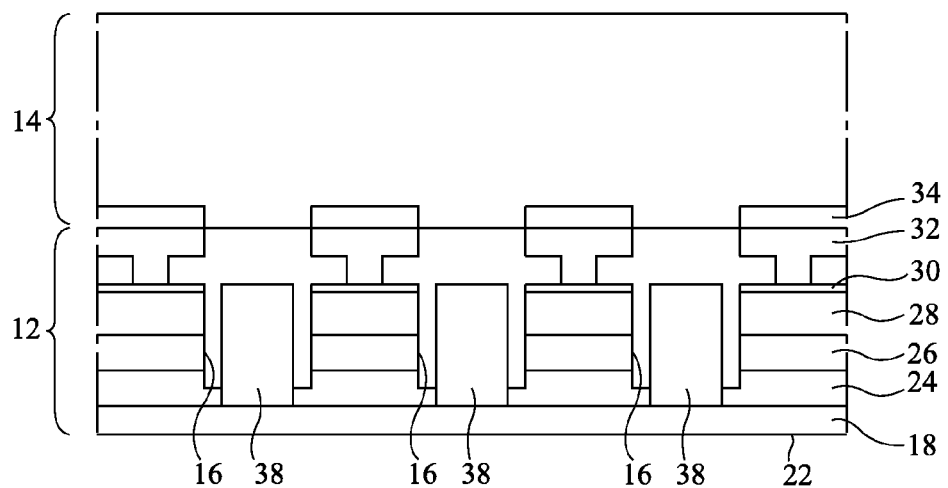

FIG. 3J shows the structure obtained after having removed substrate 60 to expose surface 22 of semiconductor layer 18. When the substrate is made of a semiconductor material, substrate 60 may be removed by a planarization step, such as a chem.-mech. polishing (CMP), and/or an etching step, such as a RIE etching. When substrate 60 is made of an insulating material such as sapphire, substrate 60 may be removed by laser ablation.

The next steps of the manufacturing method comprise the steps of forming semiconductor nanocrystals blocks 40 on surface 22 of semiconductor layer 12 to obtain the structure of optoelectronic device 10 such as shown in FIG. 1.

This may comprise the forming of a colloidal dispersion of semiconductor nanocrystals in a binding matrix, the forming of blocks 40 of the colloidal dispersion on surface 22 of semiconductor layer 18, and the drying of blocks 40.

The method of forming blocks 40 may correspond to a so-called additive process, for example, by direct printing of the colloidal dispersion at the desired locations, for example, by inkjet printing, photogravure, silk-screening, flexography, spray coating, or drop casting.

According to an embodiment, photoluminescent blocks 40 are formed by three-dimensional printing. The desired dimensions of semiconductor nanocrystal blocks 40 are compatible with the resolution of three-dimensional printers currently available for sale. Three-dimensional printing may be performed by using piezoelectric injection nozzles. As an example, the holes of the injection nozzles may be arranged in staggered rows. The colloidal dispersion may be heated to be injected at the desired viscosity by the injection nozzles. Optoelectronic chip 12 may further be heated during the printing step. The colloidal dispersion matrix may be a resin which is polymerized after the colloidal dispersion has been deposited by printing. As an example, the polymerization of the matrix may be obtained by exposing photoluminescent blocks 40 to an electromagnetic radiation, particularly an ultraviolet radiation.

The method of forming blocks 40 may correspond to a so-called subtractive method, where the colloidal dispersion is deposited all over surface 22 of layer 18 and where the non-used portions are then removed, for example, by photolithography or laser ablation. According to the considered material, the deposition over the entire structure may be performed by spin coating, spray coating, photogravure, slot-die coating, blade coating, flexography, or silk-screening.

Figure 4A:
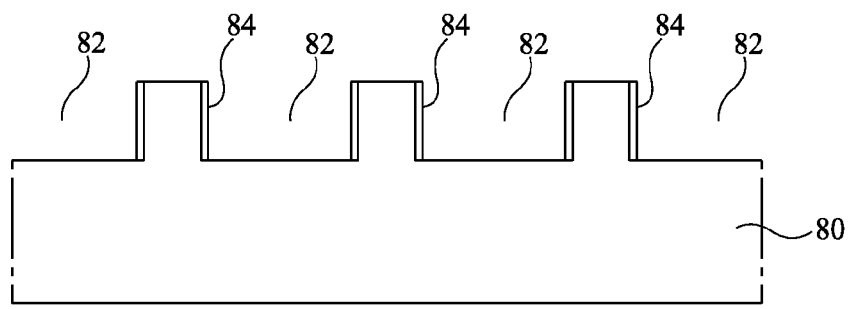
FIGS. 4A to 4B are partial simplified cross-section views of structures obtained at successive steps of an embodiment of a method of manufacturing the optoelectronic device shown in FIG. 2.
Figure 4B:
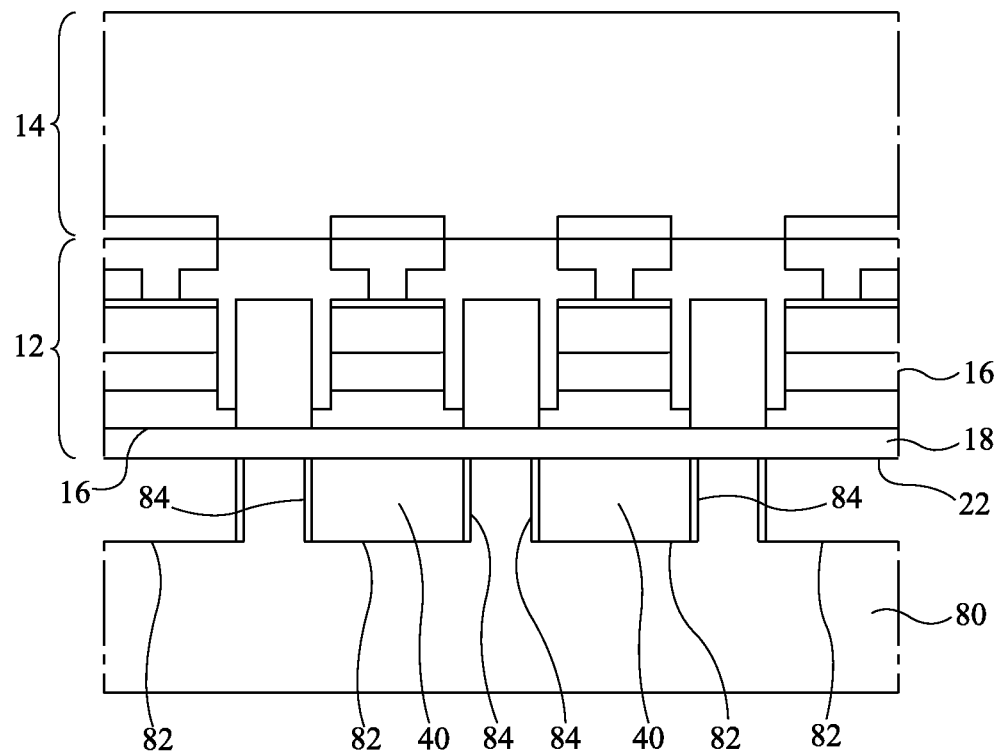

FIGS. 4A and 4B show the structures obtained at steps of an embodiment of a method of manufacturing optoelectronic device 50 shown in FIG. 2.

The initial steps of the method are those which have been previously described in relation with FIGS. 3A to 3J.

FIG. 4A shows the structure obtained after having etched, in a substrate 80, non-through openings 82 which are intended to be placed opposite light-emitting diodes 16 and after having covered the lateral walls of openings 82 with a reflective coating 84, for example, an aluminum film. The dimensions of openings 82 correspond to the desired dimensions of semiconductor nanocrystal blocks 40. Reflective coatings 84 may be formed by the deposition of a metal layer over the entire substrate 80 and an anisotropic etching of the metal layer to only keep metal coating 84 on the lateral walls of openings 82.

FIG. 4B shows the structure obtained after having formed blocks 40 of semiconductor nanocrystals in at least some of openings 82 and after having bonded substrate 80 to optoelectronic chip 12. Photoluminescent blocks 40 may be formed by filling certain openings 82 with the colloidal dispersion of the semiconductor nanocrystals, for example, by a so-called additive process, possibly by obstructing certain openings 82 with resin. The bonding of substrate 80 to optoelectronic chip 12 may be performed by direct bonding or by thermocompression.

The next steps of the embodiment of the method of manufacturing optoelectronic device 50 comprise thinning substrate 80 from the side of substrate 90 opposite to light-emitting diodes 16 to expose blocks 40 of semiconductor nanocrystals. The thinning may be performed by chem.-mech. polishing. The structure shown in FIG. 2 is then obtained.

Figure 5:
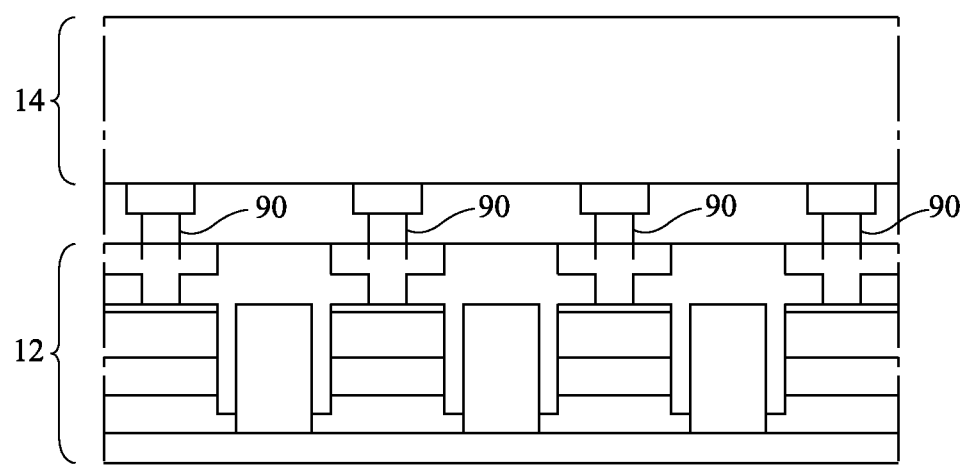
FIG. 5 is a partial simplified cross-section view of the structure obtained at a step of another embodiment of a method of manufacturing the optoelectronic device shown in FIG. 1.

FIG. 5 shows the structure obtained at a step of another embodiment of the method of manufacturing optoelectronic device 10 or 50 where the step of bonding optoelectronic chip 12 to control chip 14 uses inserts 90 between the two chips 12 and 14. As an example, inserts 90 may comprise carbon nanotubes.

Specific embodiments have been described. Various alterations and modifications will occur to those skilled in the art. In particular, although in the previously-described embodiments, optoelectronic chip 12 is directly bonded to control chip 14, optoelectronic chip 12 and control chip 14 may be each bonded to a printed circuit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing an optoelectronic device, comprising the steps of:
   (a) forming an array of light-emitting diodes, each light-emitting diode having a lateral dimension smaller than 30 µm; and
   (b) forming photoluminescent blocks opposite at least part of the light-emitting diodes, each photoluminescent block comprising semiconductor crystals having an average size smaller than 1 µm, dispersed in a binding matrix,
   wherein step (a) comprises manufacturing an optoelectronic circuit comprising the light-emitting diodes and wherein step (b) comprises forming non-through openings in a substrate, forming the photoluminescent blocks in some of the openings, bonding the substrate to the optoelectronic circuit and thinning the substrate to expose the photoluminescent blocks.

2. The method of claim 1, wherein each photoluminescent block has a thickness smaller than 30 µm, preferably smaller than 5 µm.

3. The method of claim 1, wherein step (b) comprises forming the photoluminescent blocks by an additive process in some of the openings.

* * * * *